US009379222B2

(12) United States Patent
Winstead et al.

(10) Patent No.: US 9,379,222 B2
(45) Date of Patent: Jun. 28, 2016

(54) METHOD OF MAKING A SPLIT GATE NON-VOLATILE MEMORY (NVM) CELL

(71) Applicants: Brian A. Winstead, Bridgetown (CA); Konstantin V. Loiko, Austin, TX (US)

(72) Inventors: Brian A. Winstead, Bridgetown (CA); Konstantin V. Loiko, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 118 days.

(21) Appl. No.: 14/291,320

(22) Filed: May 30, 2014

(65) Prior Publication Data

US 2015/0349096 A1 Dec. 3, 2015

(51) Int. Cl.
| | |
|---|---|
| H01L 29/66 | (2006.01) |
| H01L 29/423 | (2006.01) |
| H01L 29/49 | (2006.01) |
| H01L 21/28 | (2006.01) |
| H01L 21/3213 | (2006.01) |
| H01L 21/306 | (2006.01) |
| H01L 29/788 | (2006.01) |
| H01L 29/792 | (2006.01) |

(52) U.S. Cl.
CPC .... *H01L 29/66833* (2013.01); *H01L 21/28035* (2013.01); *H01L 21/28282* (2013.01); *H01L 21/30625* (2013.01); *H01L 21/32133* (2013.01); *H01L 29/42332* (2013.01); *H01L 29/42344* (2013.01); *H01L 29/4916* (2013.01); *H01L 29/66545* (2013.01); *H01L 29/66825* (2013.01); *H01L 29/7881* (2013.01); *H01L 29/792* (2013.01)

(58) Field of Classification Search
CPC ............. H01L 21/8239; H01L 27/11563
See application file for complete search history.

(56) References Cited

U.S. PATENT DOCUMENTS

| | | |
|---|---|---|
| 5,614,746 A | 3/1997 | Hong et al. |
| 6,087,225 A | 7/2000 | Bronner et al. |
| 6,194,301 B1 | 2/2001 | Radens et al. |
| 6,235,574 B1 | 5/2001 | Tobben et al. |
| 6,333,223 B1 | 12/2001 | Moriwaki et al. |
| 6,388,294 B1 | 5/2002 | Radens et al. |
| 6,509,225 B2 | 1/2003 | Moriwaki et al. |
| 6,531,734 B1 | 3/2003 | Wu |
| 6,635,526 B1 | 10/2003 | Malik et al. |
| 6,707,079 B2 | 3/2004 | Satoh et al. |
| 6,777,761 B2 | 8/2004 | Clevenger et al. |
| 6,785,165 B2 | 8/2004 | Kawahara et al. |
| 6,939,767 B2 | 9/2005 | Hoefler et al. |
| 7,154,779 B2 | 12/2006 | Mokhlesi et al. |

(Continued)

FOREIGN PATENT DOCUMENTS

WO    2009058486    5/2009

OTHER PUBLICATIONS

U.S. Appl. No. 13/790,225, Office Action—Allowance, Dec. 24, 2013.
U.S. Appl. No. 13/790,014, Office Action—Allowance, Dec. 24, 2013.
U.S. Appl. No. 13/442,142, Office Action—Allowance, Dec. 31, 2013.
U.S. Appl. No. 13/491,771, Office Action—Allowance, Jan. 16, 2014.

(Continued)

*Primary Examiner* — Michael Jung

(57) ABSTRACT

Making a non-volatile memory (NVM) structure uses a semiconductor substrate. One embodiment includes forming a select gate structure including a first dummy material on the semiconductor substrate and forming a control gate structure including a second dummy material on the semiconductor substrate, where the first dummy material is different from the second dummy material. The embodiment also includes replacing the first dummy material with metal and replacing the second dummy material with polysilicon.

19 Claims, 8 Drawing Sheets

(56) References Cited

U.S. PATENT DOCUMENTS

| | | | |
|---|---|---|---|
| 7,183,159 B2 | 2/2007 | Rao et al. |
| 7,190,022 B2 | 3/2007 | Shum et al. |
| 7,202,524 B2 | 4/2007 | Kim et al. |
| 7,208,793 B2 | 4/2007 | Bhattacharyya |
| 7,256,125 B2 | 8/2007 | Yamada et al. |
| 7,271,050 B2 | 9/2007 | Hill |
| 7,365,389 B1 | 4/2008 | Jeon et al. |
| 7,391,075 B2 | 6/2008 | Jeon et al. |
| 7,402,493 B2 | 7/2008 | Oh et al. |
| 7,405,968 B2 | 7/2008 | Mokhlesi et al. |
| 7,439,134 B1 | 10/2008 | Prinz et al. |
| 7,476,582 B2 | 1/2009 | Nakagawa et al. |
| 7,521,314 B2 | 4/2009 | Jawarani et al. |
| 7,524,719 B2 | 4/2009 | Steimle et al. |
| 7,544,490 B2 | 6/2009 | Ferrari et al. |
| 7,544,980 B2 | 6/2009 | Chindalore et al. |
| 7,544,990 B2 | 6/2009 | Bhattacharyya |
| 7,560,767 B2 | 7/2009 | Yasuda et al. |
| 7,795,091 B2 | 9/2010 | Winstead et al. |
| 7,799,650 B2 | 9/2010 | Bo et al. |
| 7,816,727 B2 | 10/2010 | Lai et al. |
| 7,821,055 B2 | 10/2010 | Loiko et al. |
| 7,906,396 B1 | 3/2011 | Chiang et al. |
| 7,932,146 B2 | 4/2011 | Chen et al. |
| 7,989,871 B2 | 8/2011 | Yasuda |
| 7,999,304 B2 | 8/2011 | Ozawa et al. |
| 8,017,991 B2 | 9/2011 | Kim et al. |
| 8,043,951 B2 | 10/2011 | Beugin et al. |
| 8,063,434 B1 | 11/2011 | Polishchuk et al. |
| 8,093,128 B2 | 1/2012 | Koutny et al. |
| 8,138,037 B2 | 3/2012 | Chudzik et al. |
| 8,168,493 B2 | 5/2012 | Kim |
| 8,298,885 B2 | 10/2012 | Wei et al. |
| 8,334,198 B2 | 12/2012 | Chen et al. |
| 8,372,699 B2 | 2/2013 | Kang et al. |
| 8,389,365 B2 | 3/2013 | Shroff et al. |
| 8,399,310 B2 | 3/2013 | Shroff et al. |
| 8,524,557 B1 | 9/2013 | Hall et al. |
| 8,536,006 B2 | 9/2013 | Shroff et al. |
| 8,536,007 B2 | 9/2013 | Shroff et al. |
| 8,679,927 B2 | 3/2014 | Ramkumar et al. |
| 2001/0049166 A1 | 12/2001 | Peschiaroli et al. |
| 2002/0061616 A1 | 5/2002 | Kim et al. |
| 2003/0022434 A1 | 1/2003 | Taniguchi et al. |
| 2004/0075133 A1 | 4/2004 | Nakagawa et al. |
| 2004/0262670 A1 | 12/2004 | Takebuchi et al. |
| 2005/0145949 A1 | 7/2005 | Sadra et al. |
| 2006/0038240 A1 | 2/2006 | Tsutsumi et al. |
| 2006/0046449 A1 | 3/2006 | Liaw |
| 2006/0099798 A1 | 5/2006 | Nakagawa |
| 2006/0134864 A1 | 6/2006 | Higashitani et al. |
| 2006/0211206 A1 | 9/2006 | Rao et al. |
| 2006/0221688 A1 | 10/2006 | Shukuri et al. |
| 2007/0037343 A1 | 2/2007 | Colombo et al. |
| 2007/0077705 A1 | 4/2007 | Prinz et al. |
| 2007/0115725 A1 | 5/2007 | Pham et al. |
| 2007/0215917 A1 | 9/2007 | Taniguchi |
| 2007/0224772 A1 | 9/2007 | Hall et al. |
| 2007/0249129 A1 | 10/2007 | Hall et al. |
| 2007/0264776 A1 | 11/2007 | Dong et al. |
| 2008/0029805 A1 | 2/2008 | Shimamoto et al. |
| 2008/0050875 A1 | 2/2008 | Moon et al. |
| 2008/0067599 A1 | 3/2008 | Tsutsumi et al. |
| 2008/0105945 A1 | 5/2008 | Steimle et al. |
| 2008/0121983 A1 | 5/2008 | Seong et al. |
| 2008/0128785 A1 | 6/2008 | Park et al. |
| 2008/0145985 A1 | 6/2008 | Chi |
| 2008/0185635 A1 | 8/2008 | Yanagi et al. |
| 2008/0237690 A1 | 10/2008 | Anezaki et al. |
| 2008/0237700 A1 | 10/2008 | Kim et al. |
| 2008/0283900 A1 | 11/2008 | Nakagawa et al. |
| 2008/0290385 A1 | 11/2008 | Urushido |
| 2008/0308876 A1 | 12/2008 | Lee et al. |
| 2009/0050955 A1 | 2/2009 | Akita et al. |
| 2009/0065845 A1 | 3/2009 | Kim et al. |
| 2009/0072274 A1 | 3/2009 | Knoefler et al. |
| 2009/0078986 A1 | 3/2009 | Bach |
| 2009/0101961 A1 | 4/2009 | He et al. |
| 2009/0111229 A1 | 4/2009 | Steimle et al. |
| 2009/0179283 A1 | 7/2009 | Adams et al. |
| 2009/0225602 A1 | 9/2009 | Sandhu et al. |
| 2009/0256211 A1 | 10/2009 | Booth, Jr. et al. |
| 2009/0269893 A1 | 10/2009 | Hashimoto et al. |
| 2009/0273013 A1 | 11/2009 | Winstead et al. |
| 2009/0278187 A1 | 11/2009 | Toba |
| 2011/0031548 A1 | 2/2011 | White et al. |
| 2011/0095348 A1 | 4/2011 | Chakihara et al. |
| 2011/0204450 A1 | 8/2011 | Moriya |
| 2011/0260258 A1 | 10/2011 | Zhu et al. |
| 2011/0272764 A1* | 11/2011 | Kim ............... H01L 21/28273 257/368 |
| 2012/0034751 A1 | 2/2012 | Ariyoshi et al. |
| 2012/0104483 A1 | 5/2012 | Shroff et al. |
| 2012/0132978 A1 | 5/2012 | Toba et al. |
| 2012/0142153 A1 | 6/2012 | Jeong |
| 2012/0248523 A1 | 10/2012 | Shroff et al. |
| 2012/0252171 A1 | 10/2012 | Shroff et al. |
| 2013/0026553 A1 | 1/2013 | Horch |
| 2013/0037886 A1 | 2/2013 | Tsai et al. |
| 2013/0065366 A1 | 3/2013 | Thomas et al. |
| 2013/0084684 A1 | 4/2013 | Ishii et al. |
| 2013/0137227 A1 | 5/2013 | Shroff et al. |
| 2013/0171785 A1 | 7/2013 | Shroff et al. |
| 2013/0171786 A1 | 7/2013 | Shroff et al. |
| 2013/0178027 A1 | 7/2013 | Hall et al. |
| 2013/0178054 A1 | 7/2013 | Shroff et al. |
| 2013/0264633 A1 | 10/2013 | Hall et al. |
| 2013/0264634 A1 | 10/2013 | Hall et al. |
| 2013/0267072 A1 | 10/2013 | Hall et al. |
| 2013/0267074 A1 | 10/2013 | Hall et al. |
| 2013/0323922 A1 | 12/2013 | Shen et al. |
| 2014/0035027 A1 | 2/2014 | Chakihara et al. |
| 2014/0050029 A1 | 2/2014 | Kang et al. |
| 2014/0120713 A1 | 5/2014 | Shroff et al. |
| 2014/0213030 A1* | 7/2014 | Tsukuda ............ H01L 29/66833 438/287 |
| 2015/0129952 A1* | 5/2015 | Chuang ............. H01L 27/11568 257/326 |

OTHER PUBLICATIONS

U.S. Appl. No. 13/781,727, Office Action—Allowance, Jan. 31, 2014.
U.S. Appl. No. 13/441,426, Office Action—Allowance, Feb. 21, 2014.
U.S. Appl. No. 13/442,142, Office Action—Allowance, Feb. 28, 2014.
U.S. Appl. No. 13/790,014, Office Action—Allowance, Mar. 3, 2014.
U.S. Appl. No. 13/907,491, Office Action—Allowance, Mar. 11, 2014.
U.S. Appl. No. 13/790,225, Office Action—Allowance, Mar. 12, 2014.
U.S. Appl. No. 13/781,727, Office Action—Allowance, May 12, 2014.
U.S. Appl. No. 13/343,331, Office Action—Allowance, Nov. 8, 2013
U.S. Appl. No. 14/195,299, Shroff, M., et al., "Method of Making a Logic Transistor and a Non-Volatile Memory (NVM) Cell", filed Mar. 3, 2014.
U.S. Appl. No. 14/228,672, Hall, M.D., et al., "Method of Forming a Split-Gate Device", filed Mar. 28, 2014.
U.S. Appl. No. 14/228,678, Hall, M.D., et al., "Method of Forming a Split-Gate Device", filed Mar. 28, 2014.
U.S. Appl. No. 14/228,682, Shroff, M., et al., "Method of Forming a Split-Gate Device", filed Mar. 28, 2014.
U.S. Appl. No. 13/441,426, Shroff, M. D., et al., Office Action—Allowance, mailed Jun. 9, 2014.
U.S. Appl. No. 13/491,771, Office Action mailed Mar. 6, 2014.
Chen, J.H., et al., "Nonvolatile Flash Memory Device Using Ge Nanocrystals Embedded in HfA10 High-k Tunneling and Control Oxides: Device Fabrication and Electrical Performance", IEEE Transactions on Electron Devices, vol. 51, No. 11, Nov. 2004, pp. 1840-1848.

(56) References Cited

OTHER PUBLICATIONS

Kang, T.K., et al., "Improved characteristics for Pd nanocrystal memory with stacked HfAlO-SiO2 tunnel layer", Sciencedirect.com, Solid-State Electronics, vol. 61, Issue 1, Jul. 2011, pp. 100-105, http://wwww.sciencedirect.com/science/article/pii/S0038110111000803.
Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1.4, pp. 634-637.
Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.
Liu, Z., et al., "Metal Nanocrystal Memories—Part I: Device Design and Fabrication", IEEE Transactions on Electron Devices, vol. 49, No. 9, Sep. 2002, pp. 1606-1613.
Mao, P., et al., "Nonvolatile memory devices with high density ruthenium nanocrystals", Applied Physics Letters, vol. 93, Issue 24, Electronic Transport and Semiconductors, 2006.
Mao, P., et al. "Nonvolatile Memory Characteristics with Embedded high Density Ruthenium Nanocrystals", http://iopscience.iop.org/0256-307X/26/5/056104, Chinese Physics Letters, vol. 26, No. 5, 2009.
Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.
Wang, X.P., et al., Dual Metal Gates with Band-Edge Work Functions on Novel HfLaO High-K Gate Dielectric, IEEE, Symposium on VLSI Technology Digest of Technical Papers, 2006.
U.S. Appl. No. 13/402,426, Office Action—Allowance—May 3, 2013.
U.S. Appl. No. 13/789,971, Office Action—Allowance—May 15, 2013.
U.S. Appl. No. 13/491,771, Office Action—Rejection, Sep. 9, 2013.
U.S. Appl. No. 13/442,142, Office Action—Ex Parte Quayle, Apr. 4, 2013.
U.S. Appl. No. 13/442,142, Office Action—Allowance, Aug. 2, 2013.
U.S. Appl. No. 13/907,491, Office Action—Rejection, Sep. 3, 2013.
U.S. Appl. No. 12/915,726, Office Action—Restriction, Jul. 31, 2012.
U.S. Appl. No. 12/915,726, Office Action—Allowance, Dec. 10, 2012.
U.S. Appl. No. 13/781,727, Office Action—Rejection, Aug. 22, 2013.
U.S. Appl. No. 13/077,491, Office Action—Rejection, Aug. 15, 2012.
U.S. Appl. No. 13/077,491, Office Action—Rejection, Feb. 6, 2013.
U.S. Appl. No. 13/077,491, Office Action—Allowance, Jun. 18, 2013.
U.S. Appl. No. 13/077,501, Office Action—Allowance, Nov. 26, 2012.
U.S. Appl. No. 13/313,179, Office Action—Rejection, Aug. 15, 2013.
U.S. Appl. No. 13/307,719, Office Action—Allowance, May 29, 2013.
U.S. Appl. No. 13/343,331, Office Action—Rejection, Mar. 13, 2013.
U.S. Appl. No. 13/343,331, Office Action—Allowance, Jun. 24, 2013.
U.S. Appl. No. 13/441,426, Office Action—Allowance, Sep. 9, 2013.
U.S. Appl. No. 13/780,574, Office Action—Allowance, Sep. 6, 2013.
U.S. Appl. No. 13/491,760, Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/955,665, Perera, A.H., "Non-Volatile Memory (NVM) and High K and Metal Gate Integration Using Gate First Methodology", filed Jul. 31, 2013.
U.S. Appl. No. 14/041,591, Perera, A.H., "Non-Volatile Memory (NVM) and High K and Metal Gate Integration Using Gate Last Methodology", filed Sep. 30, 2013.
U.S. Appl. No. 13/971,987, Perera, A.H., et al., "Integrated Split Gate Non-Volatile Memory Cell and Logic Structure", filed Aug. 21, 2013.
U.S. Appl. No. 13/972,372, Perera, A.H., et al., "Integrated Split Gate Non-Volatile Memory Cell and Logic Device", filed Aug. 21, 2013.
U.S. Appl. No. 14/041,647, Perera, A.H., et al., "Non-Volatile Memory (NVM) and High-K and Metal Gate Integration Using Gate-First", filed Sep. 30, 2013.
U.S. Appl. No. 14/041,662, Perera, A. H., et al., "Non-Volatile Memory (NVM) and High-K and Metal Gate Integration Using Gate-Last Methodology", filed Sep. 30, 2013.
U.S. Appl. No. 13/962,338, Perera, A.H., "Nonvolatile Memory Bitcell With Inlaid High K Metal Select Gate", filed Aug. 8, 2013.
U.S. Appl. No. 13/973,433, Perera, A.H., et al., "Method to Form a Polysilicon Nanocrystal Thin Film Storage Bitcell within a High K Metal Gate Platform Technology Using a Gate Last Process to Form Transistor Gates", filed Aug. 22, 2013.
U.S. Appl. No. 13/928,666, Hong, C. M., et al., "Non-Volatile Memory (NVM) and High Voltage Transistor Integration", filed Jun. 27, 2013.
U.S. Appl. No. 14/023,440, Baker, F.K., Jr., et al., "Non-Volatile Memory (NVM) Cell and High-K and Metal Gate Transistor Integration", filed Sep. 10, 2013.
U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.
U.S. Appl. No. 13/973,549, Hong, C.M., et al., "Split-Gate non-Volatile Memory (NVM) Cell and Device Structure Integration", filed Aug. 22, 2013.
U.S. Appl. No. 13/780,591, Hall, M.D., et al., "Non-Volatile Memory (NVM) and Logic Integration", filed Feb. 28, 2013.
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", file Oct. 26, 2012.
U.S. Appl. No. 13/781,727, Office Action—Restriction, Jun. 21, 2013.
U.S. Appl. No. 13/780,591, Office Action—Allowance, Nov. 22, 2013.
U.S. Appl. No. 13/928,666, Hong, Office Action—Rejection, mailed Jul. 23, 2014.
U.S. Appl. No. 14/041,662, Perera, Office Action—Restriction, mailed Aug. 1, 2014.
U.S. Appl. No. 13/969,180, Perera, Office Action—Allowance, mailed Aug. 5, 2014.
U.S. Appl. No. 13/781,727, Shroff, Office Action—Allowance, mailed Aug. 15, 2014.
U.S. Appl. No. 13/955,665, Office Action—Allowance, mailed Aug. 20, 2014.
U.S. Appl. No. 13/973,549, Hong, Office Action—Restriction, mailed Aug. 26, 2014.
U.S. Appl. No. 13/441,426, Shroff, Office Action—Allowance, mailed Sep. 26, 2014.
U.S. Appl. No. 13/661,157, Office Action—Restriction, mailed Oct. 2, 2014.
U.S. Appl. No. 14/041,662, Perera, Office Action—Allowance, mailed Oct. 17, 2014.

\* cited by examiner

METHOD OF MAKING A SPLIT GATE NON-VOLATILE MEMORY (NVM) CELL

BACKGROUND

1. Field

This disclosure relates generally to non-volatile memory (NVM) manufacturing, and more specifically, to the making split gate NVM cells.

2. Related Art

Non-volatile memories (NVMs) have become very significant in the semiconductor industry and thus the manner of making them has also become very significant. The cost of making the NVM is accordingly kept as low as possible while achieving the needed performance. Ways of achieving this normally includes using techniques that can be implemented with commonly available equipment and using materials that are well characterized. An effective approach for achieving the desired performance has been found to be the use of split gate NVM cells which utilize a select gate and a control gate over a continuous channel.

Accordingly there is a need to provide further improvement in achieving both low cost and high performance for split gate NVM cells.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a split gate NVM cell is formed using replacement gate for both the select gate and the control gate. The material of the dummy select gate is chosen so that the dummy control gate and other exposed materials are not appreciably etched during the etch, which is performed without requiring photolithographic mask, of the dummy select gate. The dummy select gate is then replaced with a metal select gate. The material of the dummy control gate is chosen so that the metal select gate and the other exposed materials are not appreciably etched during the etch, which is performed without requiring photolithographic mask, of the dummy control gate. The dummy control gate is then replaced with a material that results in the control gate used in the final split gate NVM cell. This is better understood by the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
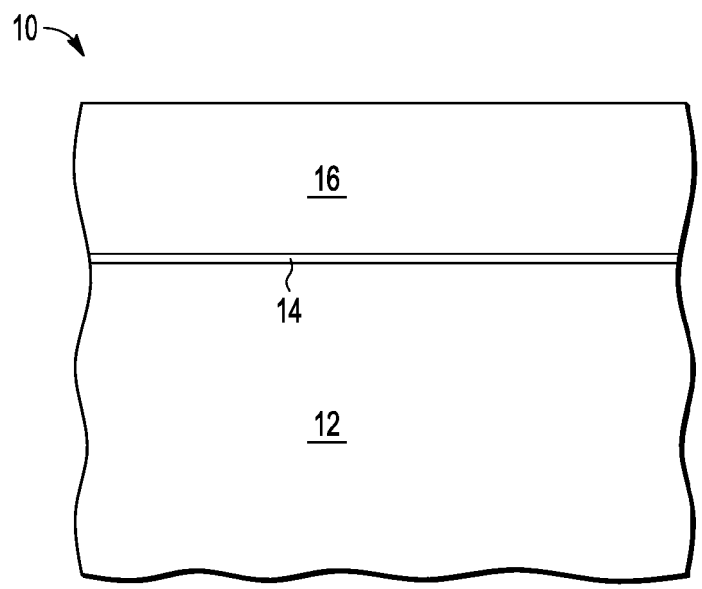
FIG. 1 is a cross section of a split gate non-volatile memory (NVM) cell according to a first embodiment at a stage in processing.

Shown in FIG. 1 is a semiconductor device 10 having a substrate 12, a gate dielectric 14 on a top surface of the substrate, and a dummy gate layer 16 on gate dielectric 14. Gate dielectric 14 may be a thermal oxide or other material such as a high-k dielectric. Dummy gate layer 16 may be, for example, polysilicon. Dummy gate layer 16 is about the desired thickness of the select gate to be formed.

Figure 2:
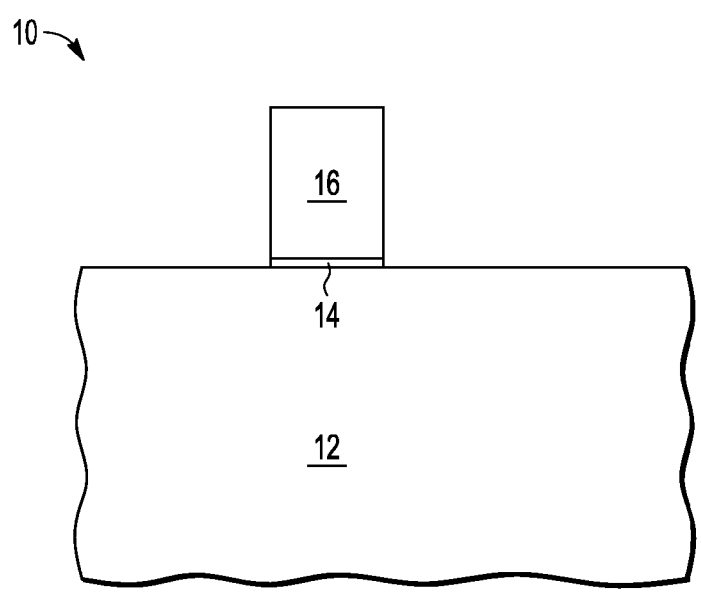
FIG. 2 is a cross section of the split gate NVM cell of FIG. 1 at a subsequent stage in processing.

Shown in FIG. 2 is semiconductor device 10 after performing an etch of dummy gate layer 16 and gate dielectric 14 to form a dummy select gate which is the resulting patterned dummy gate layer 16. This etch is a patterned etch using photolithography. Etches using photolithography involve a mask that is used to expose a pattern on photoresist. The resulting patterned photoresist may be directly used or indirectly used through a hard mask in the etch to form the dummy select gate. This etch exposes a portion of the top surface of substrate 12 adjacent to the dummy select gate.

Figure 3:
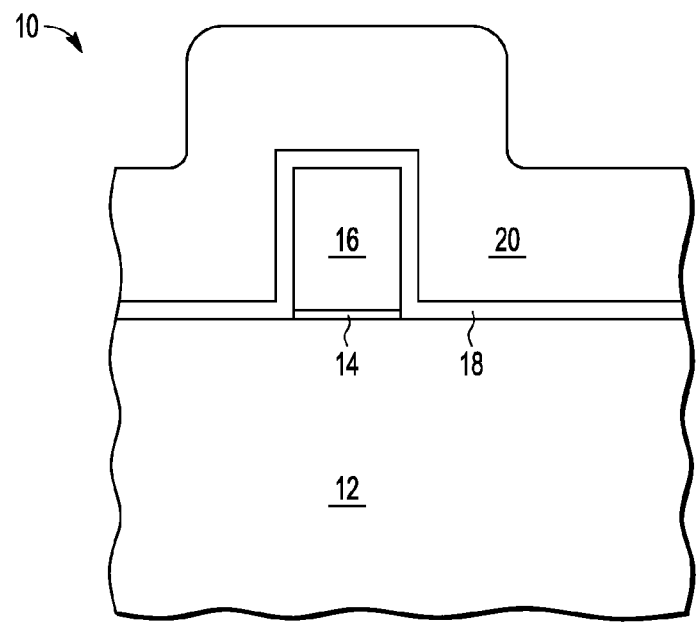
FIG. 3 is a cross section of the split gate NVM cell of FIG. 2 at a subsequent stage in processing.

Shown in FIG. 3 is semiconductor device 10 after forming a charge storage layer 18 over the exposed top surface of substrate 12, along the sides of the dummy select gate, and on the top of the dummy select gate. Charge storage layer 18 may be nanocrystals. Charge storage layer 18 may also use another type of charge storage such as nitride. In the case of nanocrystals as the charge storage, charge storage layer 18 may be formed by forming a first oxide layer, forming nanocrystals on the first oxide layer, and forming a second oxide layer that is among and over the nanocrystals. Also shown in FIG. 3 is semiconductor device 10 after forming a layer 20 of dummy control gate material over charge storage layer 18. Layer 20 may be titanium nitride (TiN). Titanium nitride can be etched selectively to many metals that are used as metal gates and to silicon oxide. It can also be etched selective to silicon nitride. Layer 20 is about the thickness of the dummy select gate which is patterned dummy gate layer 16.

Figure 4:
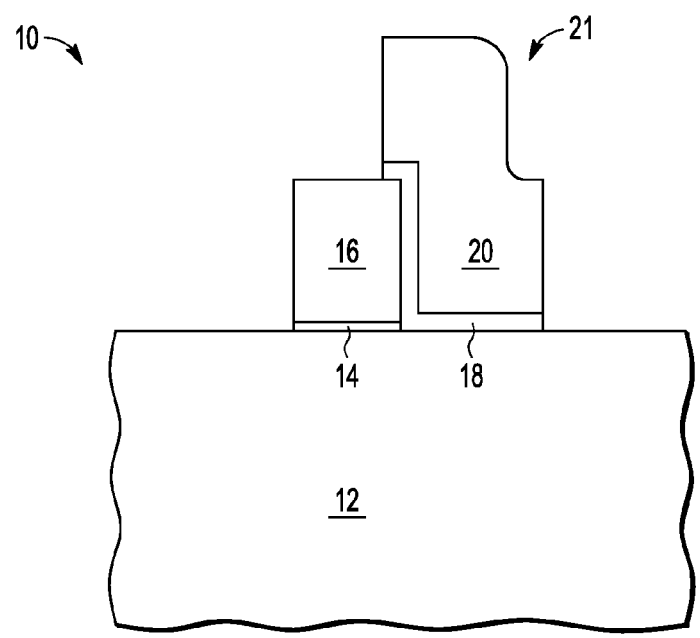
FIG. 4 is a cross section of the split gate NVM cell of FIG. 3 at a subsequent stage in processing.

Shown in FIG. 4 is semiconductor device 10 after patterning layer 20 and charge storage layer 18 using a patterned etch using photolithography. A small portion of the top surface of the dummy select gate, which is patterned dummy gate layer 16, has a remaining portion of charge storage layer 18 and layer 20. The remaining portion of charge storage layer 18 and layer 20 also extends from a side of the dummy select gate over substrate 12 which, in combination with the dummy select gate, establish a gate length of the split gate NVM cell being formed. An upper portion 21 of the remaining portion of charge storage layer 18 and layer 20 that is higher than the top surface of the dummy select gate can be considered a sacrificial portion because upper portion 21 will be removed prior to replacing the dummy select gate with a metal select gate. Also upper portion 21 will be removed to leave a dummy control gate of the remaining portion of layer 20.

Figure 5:
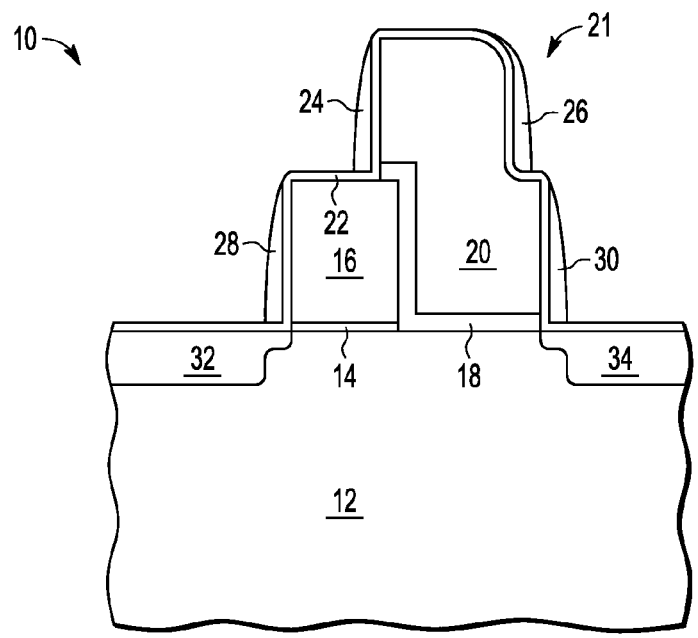
FIG. 5 is a cross section of the split gate NVM cell of FIG. 4 at a subsequent stage in processing.

Shown in FIG. 5 is semiconductor device 10 after forming a liner 22 on the exposed surfaces of the semiconductor device 10 of FIG. 4, forming sidewall spacer 24 and sidewall spacer 26 around upper portion 21 on liner 22, forming sidewall spacer 28 on the side of the dummy select gate, which is patterned dummy gate layer 16, that is away from the remaining portion of charge storage layer 18 and layer 20, and forming a sidewall spacer 30 on the side of the remaining portion of charge storage layer 18 and layer 20 that is away from the dummy select gate. Also shown in FIG. 5 is semiconductor device 10 after forming source/drain region 32 substrate 12 using sidewall spacer 28 and forming source/drain region 34 using sidewall spacer 30.

Figure 6:
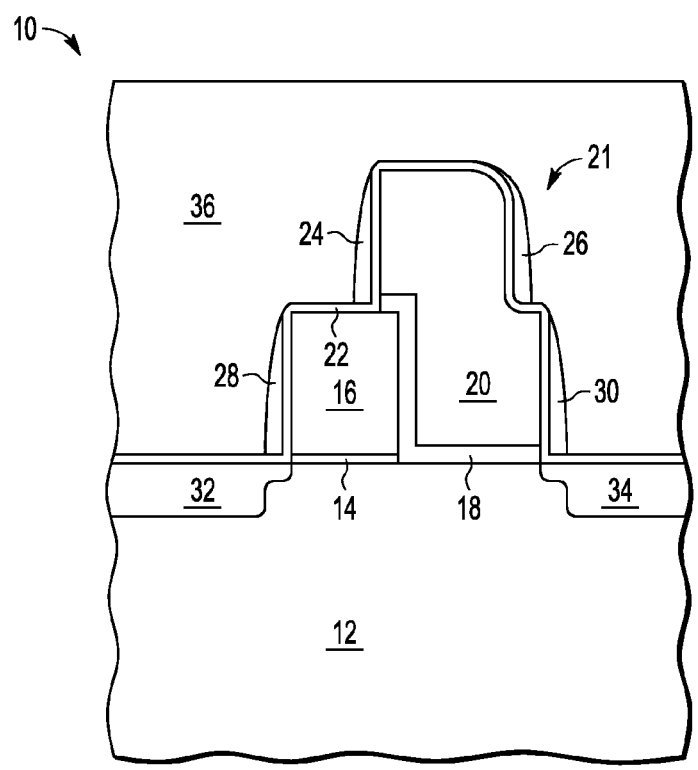
FIG. 6 is a cross section of the split gate NVM cell of FIG. 5 at a subsequent stage in processing.

Shown in FIG. 6 is semiconductor device 10 after forming an interlayer dielectric (ILD) 36 over semiconductor device 10 sufficiently thick to cover upper portion 21.

Figure 7:
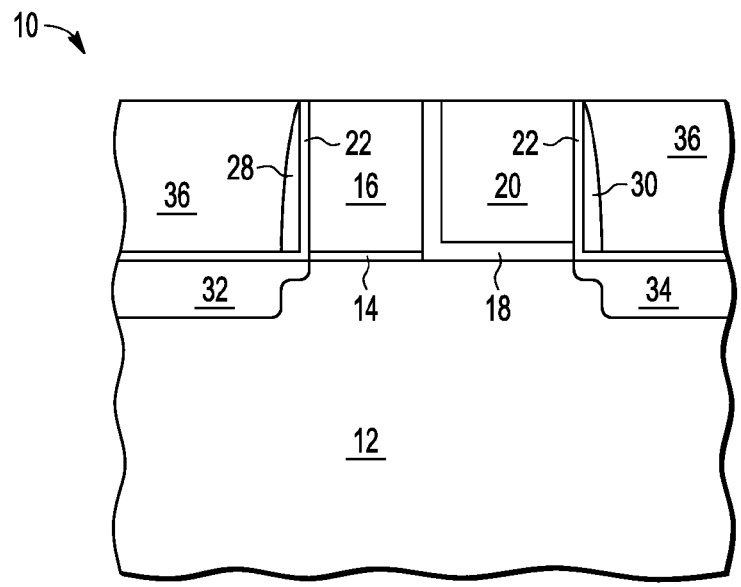
FIG. 7 is a cross section of the split gate NVM cell of FIG. 6 at a subsequent stage in processing.
Figure 10:
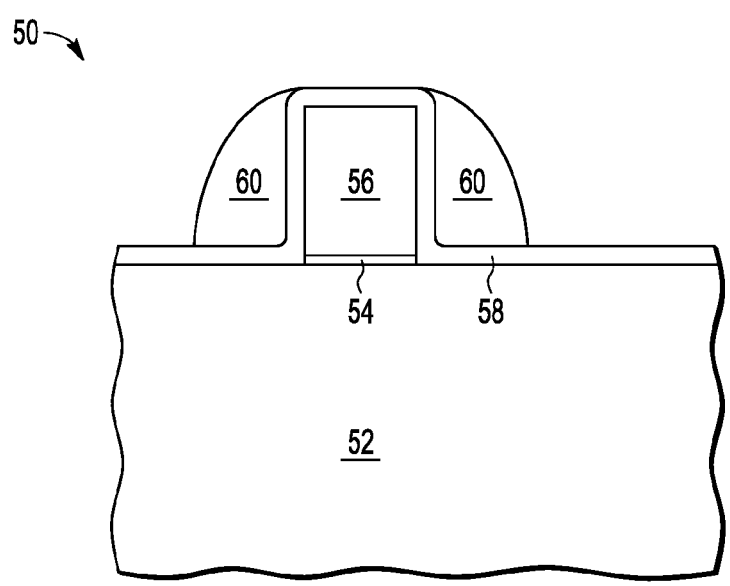
FIG. 10 is a cross section of a split gate NVM cell according to a second embodiment at a stage in processing.

Shown in FIG. 7 is semiconductor device 10 after performing a planarizing step that removes the portion of semiconductor device 10 shown in FIG. 10 higher than the top surface of the dummy select gate which is patterned dummy gate layer 16. The planarizing step, which may be by chemical mechanical polishing (CMP), leaves the top surface of layer 20 and the exposed surface of charge storage layer 18 coplanar with the top surface of the dummy select gate. The remaining portion of layer 20 is a dummy control gate.

Figure 8:
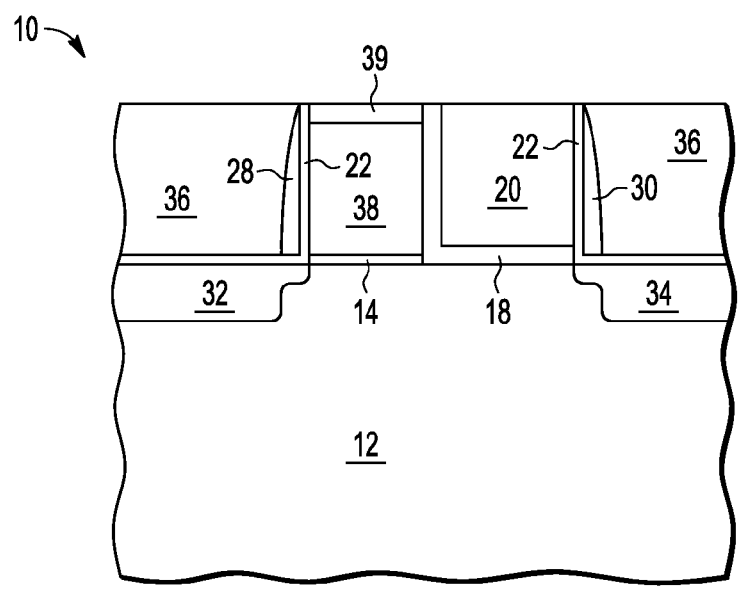
FIG. 8 is a cross section of the split gate NVM cell of FIG. 7 at a subsequent stage in processing.

Shown in FIG. 8 is semiconductor device 10 after replacing the dummy select gate, which is the patterned dummy gate layer 16, with a select gate stack 38 in which at least a top portion 39 is resistant to an etch of remaining layer 20. For example, top portion 39 could simply be the top portion of the metal used in forming select gate stack 38 or it could be a different material such as polysilicon, or even an insulating material such as silicon oxide or silicon nitride. Select gate stack 38 may also have a thin barrier metal that functions as a work function setting material that interfaces with gate dielectric 14. As a further alternative, gate dielectric 14 may be removed and replaced with a different gate dielectric. The etchant for removing the dummy select gate, for the case where the dummy select gate is polysilicon, may be chlorine/oxygen (Cl2/O2) plasma.

Figure 9:
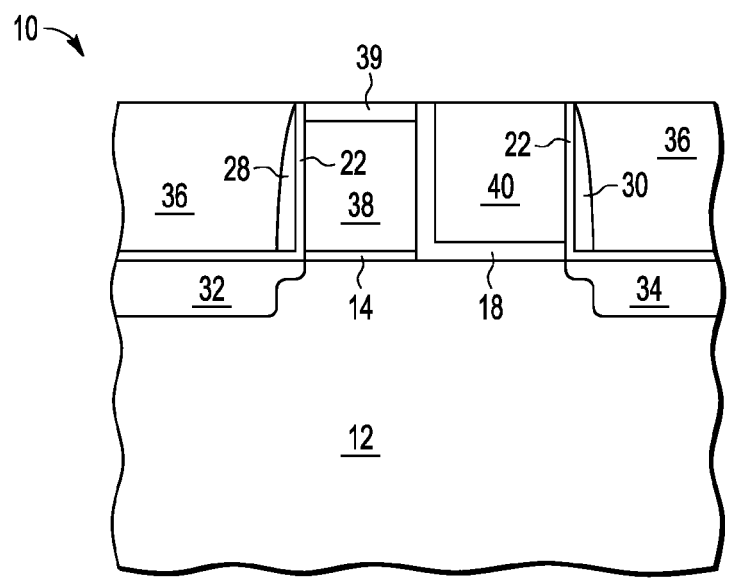
FIG. 9 is a cross section of the split gate NVM cell of FIG. 8 at a subsequent stage in processing.

Shown in FIG. 9 is semiconductor device 10 after replacing the remaining portion of layer 20 with a select gate 40, which may be polysilicon. An etchant, in the case of layer 20 being TiN, that can be used in the removal of the remaining portion of layer 20 is sulfuric acid and peroxide (H2SO4/H2O2) with top portion of 39 being a layer of oxide.

Shown in FIG. 10 is semiconductor device 10 showing an alternative to obtaining FIG. 4 following from FIG. 3. The result in FIG. 10 occurs from an anisotropic etch applied to the structure of FIG. 3. In FIG. 10, there is dummy select gate 56 on gate dielectric 54 with an overlying dummy control gate layer 60 having been etched with an anisotropic etch. The anisotropic etch results in sidewall spacers, which are shown in FIG. 10, of dummy control gate material 60. Dummy control gate material 60 may be titanium nitride.

Figure 11:
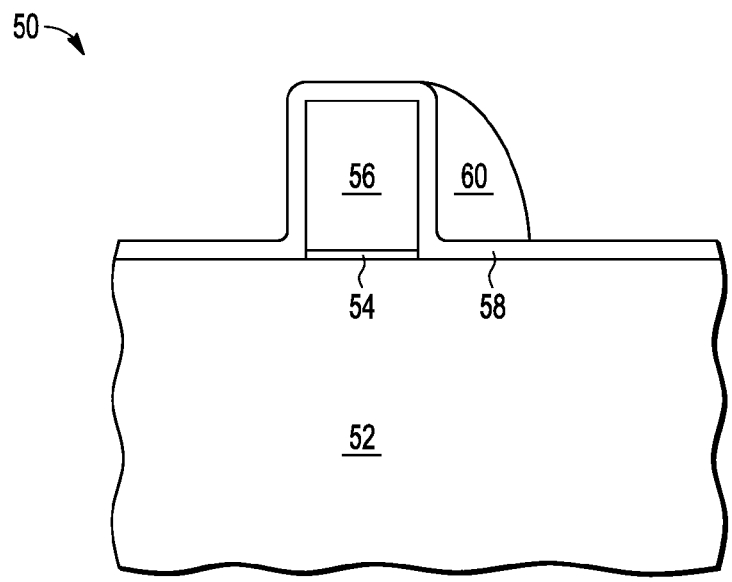
FIG. 11 is a cross section of the split gate NVM cell of FIG. 10 at a subsequent stage in processing.

Shown in FIG. 11 is semiconductor device 50 after pattern etching using photolithography to remove a portion of the sidewall spacers of control gate material 60 to leave a dummy control gate after the pattern etching. As shown, a remaining portion of dummy control gate layer 60, which is the dummy control gate, is left on one side of dummy select gate 55 and dummy control gate layer 60 is removed from the other side of dummy select gate 55. Thus, this remaining portion of dummy control gate layer 60 is a spacer structure and may be referenced as dummy control gate 60.

Figure 12:
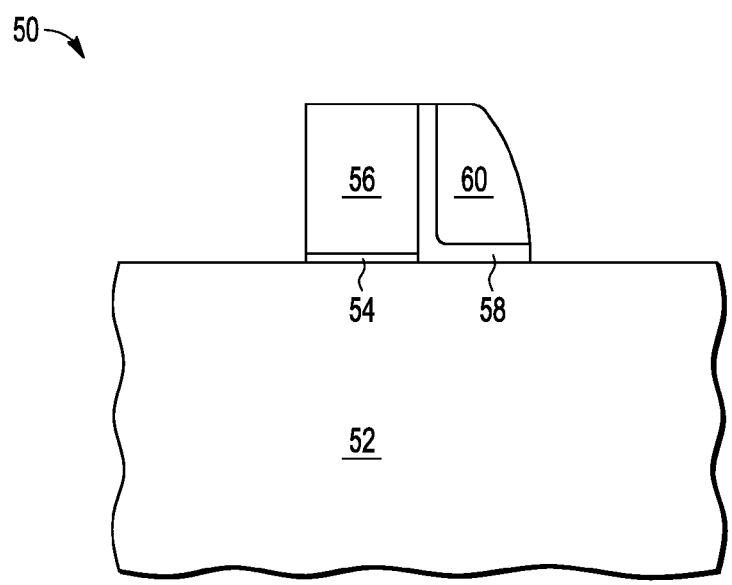
FIG. 12 is a cross section of the split gate NVM cell of FIG. 10 at a subsequent stage in processing.

Shown in FIG. 12 is semiconductor device 50 after removing charge storage layer 58 where it is exposed. This can be achieved without a masking step so that photolithography is not required.

Figure 13:
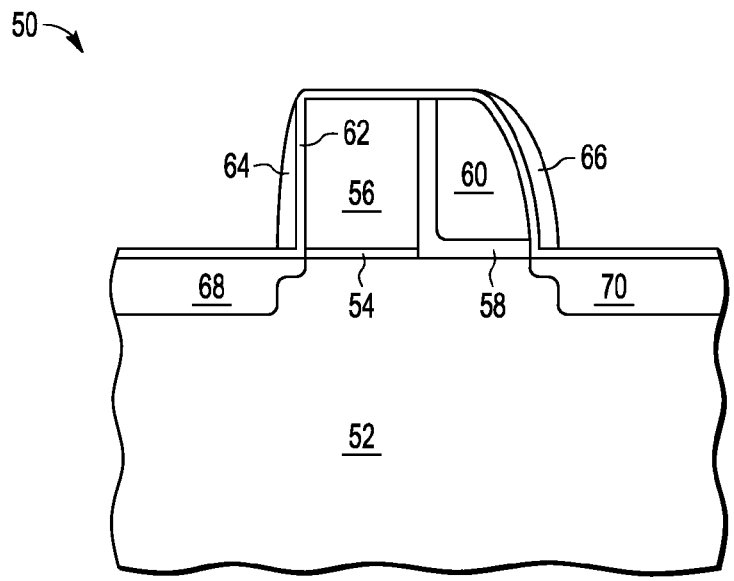
FIG. 13 is a cross section of the split gate NVM cell of FIG. 10 at a subsequent stage in processing.

Shown in FIG. 13 is semiconductor device 50 after forming a liner 62 over semiconductor device 10 of FIG. 12. Liner 62 may be deposited silicon oxide. On the side of dummy select gate 56 away from the dummy control gate 60 is formed a sidewall spacer which may be silicon nitride. On the side of dummy control gate 60 on the side away from dummy select gate 56 is a sidewall spacer 66 which may be silicon nitride. In substrate 52 on the side of sidewall spacer 64 is a source/drain 68 and on the side of sidewall spacer 66 is a source/drain 70.

Figure 14:
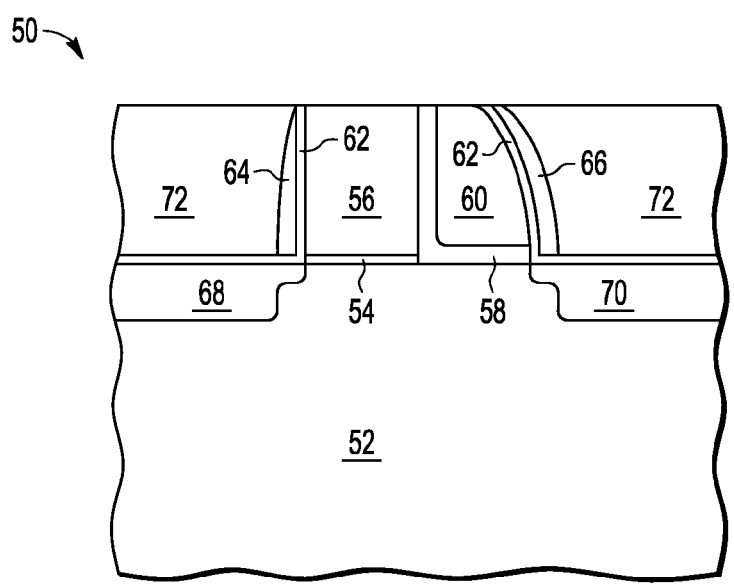
FIG. 14 is a cross section of the split gate NVM cell of FIG. 10 at a subsequent stage in processing.

Shown in FIG. 14 is semiconductor device 50 after forming an interlayer dielectric 72 having a top surface that has been planarized to be coplanar with the top surface of dummy select gate 56 and the top surface of dummy control gate 60.

Figure 15:
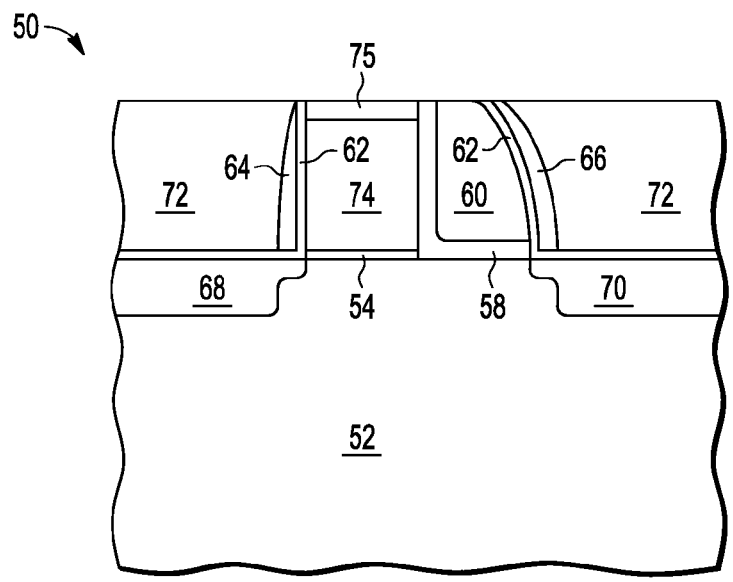
FIG. 15 is a cross section of the split gate NVM cell of FIG. 10 at a subsequent stage in processing.

Shown in FIG. 15 is semiconductor device 50 after replacing dummy select gate 56 with select gate 74 having metal and having a top portion which is chosen for its etch characteristic relative to the etchant used to etch dummy control gate 60. In the replacing, an etchant is applied to remove dummy select gate 56. In the case of dummy select gate 56 being polysilicon, ILD 72 being silicon oxide, and dummy control gate 60 being TiN, the etchant may be chlorine/oxygen (Cl2/O2) plasma.

Figure 16:
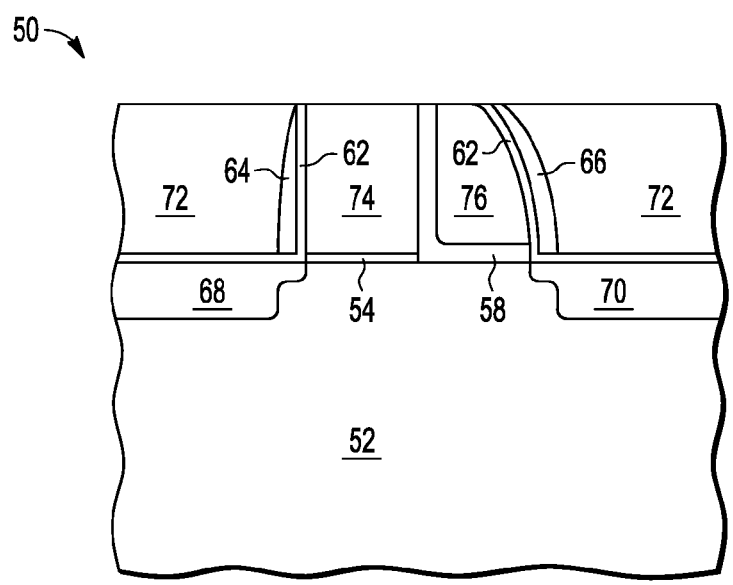
FIG. 16 is a cross section of the split gate NVM cell of FIG. 10 at a subsequent stage in processing.

Shown in FIG. 16 is semiconductor device 50 after replacing dummy control gate 60 with control gate 76 that may include polysilicon. This resulting replacement of control gate 76 may also be considered a spacer structure. In the case of top portion 75 being silicon oxide and dummy control gate 60 being TiN, the etchant used in removing dummy control gate 60 may be sulfuric acid and peroxide (H2SO4/H2O2). The approach described for FIGS. 10-16 is very similar to that described for FIGS. 1-9. The formation of dummy control gate 60 by an isotropic etch used in forming sidewall spacers is the significant difference. The considerations in choosing etchants and materials for dummy select and control gates and the material for the select gate are relevant for both approaches.

As shown, an effective use of existing materials and corresponding equipment and reduced requirement for masking steps results in an efficient manufacturing process for split gate NVMs.

By now it is apparent there has been disclosed a method of making a semiconductor structure using a substrate, wherein the semiconductor structure comprises a split gate non-volatile memory (NVM) structure in an NVM region of the semiconductor structure. The method includes forming a dummy select gate structure including a first material on the substrate. The method further includes forming a dummy control gate structure including a second material on the substrate, wherein the first material is different from the second material. The method further includes replacing the dummy select gate structure with a metal select gate structure, wherein the replacing the dummy select gate structure includes removing the dummy select gate structure without removing the dummy control gate structure and replacing the dummy control gate structure with a polysilicon control gate structure and the replacing the dummy control gate structure includes removing the dummy control gate structure without removing the metal select gate structure. The method may have a further characterization by which the replacing the dummy select gate structure includes etching the first material included in the dummy select gate structure using an etchant to leave an opening, wherein the etchant substantially removes the first material and the etchant does not substantially remove the second material included in the dummy control gate structure. The method may have a further characterization by which the replacing the dummy select gate structure further includes forming a metal gate stack in the opening to form the metal select gate structure. The method may have a further characterization by which the replacing the dummy control gate structure includes etching the second material included in the dummy control gate structure using an etchant to leave an opening, wherein the etchant substantially removes the second material and the etchant does not substantially remove the third material included in the metal select gate structure. The method may have a further characterization by which the third material forms a capping layer on the metal select gate structure. The method may have a further characterization by which the replacing the dummy control gate structure further includes forming a polysilicon gate stack in the opening to form the polysilicon control gate structure. The method may have a further characterization by which the forming the dummy select gate structure and the forming the dummy control gate structure includes forming a charge storage layer over the substrate including over a first portion of the first material and along a side of the first portion, forming a second layer of the second material over the charge storage layer, and etching the second layer and the charge storage layer to form the dummy select gate structure and the dummy control gate structure. The method may further include, prior to the replacing the dummy select gate structure and the replacing the dummy control gate structure, forming an interlayer dielectric (ILD) layer over the substrate including over the dummy select gate structure and the dummy control gate structure and performing chemical mechanical polishing on the NVM region to reveal a top first surface of the first material and a second top surface of the second material. The method may have a further characterization by which an etchant utilized in one of the replacing the dummy select gate structure and the replacing the dummy control gate structure does not substantially remove oxide and an interlayer dielectric (ILD) material. The method may have a further characterization by which the dummy control gate structure is a spacer structure.

Disclosed also is a method of making a split gate non-volatile memory (NVM) structure using a semiconductor substrate. The method includes etching a first dummy material included in a dummy select gate stack formed on the semiconductor substrate to form a first opening, wherein the etching the first dummy material does not substantially remove a second dummy material included in a dummy control gate stack formed on the semiconductor substrate and the first dummy material is different from the second dummy material. The method further includes forming a metal select gate stack in the first op. The method further includes etching the second dummy material to form a second opening, wherein the etching the second dummy material does not substantially remove a third material included in the metal select gate stack. The method further includes forming a polysilicon control gate stack in the second opening. The method may further include forming the dummy select gate stack and the dummy control gate stack including etching a first layer of the first dummy material formed over the semiconductor substrate to form at least a first side of the dummy select gate stack, forming a charge storage layer over the semiconductor substrate including along the first side of the dummy select gate stack, forming a second layer of the second dummy material over the charge storage layer, and etching the second layer and the charge storage layer to form the dummy control gate stack and a second side of the dummy select gate stack. The method may have a further characterization by which the etching the second layer and the charge storage layer further includes etching the first layer to form the second side of the dummy select gate stack. The method may further include, prior to the etching the first layer and the etching the second layer and the charge storage layer, forming an interlayer dielectric (ILD) layer over the semiconductor substrate including over the dummy select gate stack and the dummy control gate stack. The method may further include, prior to the etching the first layer and the etching the second layer and the charge storage layer, performing chemical mechanical polishing on the semiconductor substrate to reveal a first top surface of the first dummy material included in the dummy select gate stack and a second top surface of the second dummy material included in the dummy control gate stack. The method may have a further characterization by which the chemical mechanical polishing removes an upper portion of the dummy select gate stack and of the dummy control gate stack. The method may further include forming sidewall spacers along the second side of the dummy select gate stack and a third side of the dummy control gate stack. The method may have a further characterization by which the etching the second layer and the charge storage layer includes performing a spacer etch on the second layer to form the dummy control gate stack, wherein, the dummy control gate stack is a spacer structure. The method may have a further characterization by which the third material forms a capping layer on the metal select gate stack.

Also disclosed is a method for making a non-volatile memory (NVM) structure using a semiconductor substrate. The method includes forming a select gate structure including a first dummy material on the semiconductor substrate. The method further includes forming a control gate structure including a second dummy material on the semiconductor substrate, wherein the first dummy material is different from the second dummy material. The method further includes replacing the first dummy material with metal. The method further includes replacing the second dummy material with polysilicon.

Although the invention is described herein with reference to specific embodiments, various modifications and changes can be made without departing from the scope of the present invention as set forth in the claims below. For example, materials used for dummy select gates, dummy control gates, and for the select gates can be varied with the corresponding effect that different etchants may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of making a semiconductor structure using a substrate, wherein the semiconductor structure comprises a split gate non-volatile memory (NVM) structure in an NVM region of the semiconductor structure, the method comprising:
    forming a dummy select gate structure including a first material on the substrate;
    forming a dummy control gate structure including a second material on the substrate, wherein
        the first material is different from the second material;
    replacing the dummy select gate structure with a metal select gate structure, wherein
        the replacing the dummy select gate structure comprises
            removing the dummy select gate structure without removing the dummy control gate structure; and
    replacing the dummy control gate structure with a polysilicon control gate structure, wherein
        the replacing the dummy control gate structure comprises
            removing the dummy control gate structure without removing the metal select gate structure.

2. The method of claim 1, wherein
the replacing the dummy select gate structure comprises
    etching the first material included in the dummy select gate structure using an etchant to leave an opening, wherein
        the etchant substantially removes the first material, and
        the etchant does not substantially remove the second material included in the dummy control gate structure.

3. The method of claim 2, wherein
the replacing the dummy select gate structure further comprises
    forming a metal gate stack in the opening to form the metal select gate structure.

4. The method of claim 1, wherein
the replacing the dummy control gate structure comprises
    etching the second material included in the dummy control gate structure using an etchant to leave an opening, wherein
        the etchant substantially removes the second material, and
        the etchant does not substantially remove the third material included in the metal select gate structure.

5. The method of claim 4, wherein
the third material forms a capping layer on the metal select gate structure.

6. The method of claim 4, wherein
the replacing the dummy control gate structure further comprises
    forming a polysilicon gate stack in the opening to form the polysilicon control gate structure.

7. The method of claim 1, wherein
the forming the dummy select gate structure and the forming the dummy control gate structure comprises
    forming a charge storage layer over the substrate including over a first portion of the first material and along a side of the first portion,
    forming a second layer of the second material over the charge storage layer, and
    etching the second layer and the charge storage layer to form the dummy select gate structure and the dummy control gate structure.

8. The method of claim 1, further comprising
prior to the replacing the dummy select gate structure and the replacing the dummy control gate structure,
    forming an interlayer dielectric (ILD) layer over the substrate including over the dummy select gate structure and the dummy control gate structure, and
    performing chemical mechanical polishing on the NVM region to reveal a top first surface of the first material and a second top surface of the second material.

9. The method of claim 1, wherein
an etchant utilized in one of the replacing the dummy select gate structure and the replacing the dummy control gate structure does not substantially remove oxide and an interlayer dielectric (ILD) material.

10. The method of claim 1, wherein
the dummy control gate structure is a spacer structure.

11. A method of making a split gate non-volatile memory (NVM) structure using a semiconductor substrate, the method comprising:
    etching a first dummy material included in a dummy select gate stack formed on the semiconductor substrate to form a first opening, wherein
        the etching the first dummy material does not substantially remove a second dummy material included in a dummy control gate stack formed on the semiconductor substrate, and
        the first dummy material is different from the second dummy material;
    forming a metal select gate stack in the first opening;
    etching the second dummy material to form a second opening, wherein
        the etching the second dummy material does not substantially remove a third material included in the metal select gate stack; and
    forming a polysilicon control gate stack in the second opening.

12. The method of claim 11, further comprising
forming the dummy select gate stack and the dummy control gate stack, comprising:
    etching a first layer of the first dummy material formed over the semiconductor substrate to form at least a first side of the dummy select gate stack,
    forming a charge storage layer over the semiconductor substrate including along the first side of the dummy select gate stack,
    forming a second layer of the second dummy material over the charge storage layer, and
    etching the second layer and the charge storage layer to form the dummy control gate stack and a second side of the dummy select gate stack.

13. The method of claim 12, wherein
the etching the second layer and the charge storage layer further comprises
    etching the first layer to form the second side of the dummy select gate stack.

14. The method of claim 13, further comprising
prior to the etching the first layer and the etching the second layer and the charge storage layer,
    forming an interlayer dielectric (ILD) layer over the semiconductor substrate including over the dummy select gate stack and the dummy control gate stack.

15. The method of claim 13, further comprising
prior to the etching the first layer and the etching the second layer and the charge storage layer,
    performing chemical mechanical polishing on the semiconductor substrate to reveal a first top surface of the first dummy material included in the dummy select gate stack and a second top surface of the second dummy material included in the dummy control gate stack.

16. The method of claim 15, wherein
the chemical mechanical polishing removes an upper portion of the dummy select gate stack and of the dummy control gate stack.

17. The method of claim 12, further comprising
forming sidewall spacers along the second side of the dummy select gate stack and a third side of the dummy control gate stack.

18. The method of claim 12, wherein
the etching the second layer and the charge storage layer comprises
 performing a spacer etch on the second layer to form the dummy control gate stack, wherein
 the dummy control gate stack is a spacer structure.

19. The method of claim 11, wherein
the third material forms a capping layer on the metal select gate stack.

\* \* \* \* \*